US011274986B2

(12) United States Patent
Bohl et al.

(10) Patent No.: US 11,274,986 B2
(45) Date of Patent: Mar. 15, 2022

(54) HOUSING WITH PRESSURE COMPENSATING ELEMENT

(71) Applicant: TDK Electronics AG, Munich (DE)

(72) Inventors: Benjamin Bohl, Berlin (DE); Daniel Mietke, Ahrensfelde (DE)

(73) Assignee: TDK ELECTRONICS AG, Munich (DE)

(*) Notice: Subject to any disclaimer, the term of this patent is extended or adjusted under 35 U.S.C. 154(b) by 0 days.

(21) Appl. No.: 16/767,522

(22) PCT Filed: Nov. 30, 2018

(86) PCT No.: PCT/EP2018/083193
§ 371 (c)(1),
(2) Date: May 27, 2020

(87) PCT Pub. No.: WO2019/106169
PCT Pub. Date: Jun. 6, 2019

(65) Prior Publication Data
US 2020/0370985 A1  Nov. 26, 2020

(30) Foreign Application Priority Data
Nov. 30, 2017 (DE) .......................... 102017128460.5

(51) Int. Cl.
*G01L 19/14* (2006.01)
*G01L 19/06* (2006.01)

(52) U.S. Cl.
CPC ............ *G01L 19/141* (2013.01); *G01L 19/06* (2013.01); *G01L 19/0618* (2013.01); *G01L 19/14* (2013.01)

(58) Field of Classification Search
CPC ..... G01L 19/147; G01L 9/0042; G01L 19/04; G01L 9/0054; G01L 9/0072;
(Continued)

(56) References Cited

U.S. PATENT DOCUMENTS 7,344,578 B2  3/2008 Origlia
7,838,768 B2  11/2010 Zadach et al.
(Continued)

FOREIGN PATENT DOCUMENTS

CN         1459392 A    12/2003
CN       201802938 U     4/2011
(Continued)

OTHER PUBLICATIONS

Schreiner, "DAE HighProtect; IP 69K—Resistant Pressure Compensation Membrane," Schreiner Pro Tech, Product Information, machine translation Jun. 9, 2020, pp. 1-3.
(Continued)

*Primary Examiner* — Andre J Allen
(74) *Attorney, Agent, or Firm* — Slater Matsil, LLP

(57) ABSTRACT

A housing is disclosed. In an embodiment a housing includes a housing opening, a pressure-compensating element mounted on an inner side of the housing opening, a protective wall mounted on an outer side of the housing opening surrounding the housing opening and a bridge arranged over the outer side of the housing opening and protruding beyond the housing opening, wherein the bridge is shaped and arranged such that a projection of the bridge at least partially covers the housing opening.

20 Claims, 4 Drawing Sheets

(58) Field of Classification Search
CPC ... G01L 13/025; G01L 19/14; G01L 19/0038;
G01L 19/0084; G01L 9/0055; G01L
9/0075; G01L 19/0069; G01L 9/0052;
G01L 9/0073; G01L 19/0092; G01L
19/0618; G01L 19/0645; G01L 19/143;
G01L 9/0051; G01L 19/0007; G01L
19/0046; G01L 19/06; G01L 19/0627;
G01L 19/0681; G01L 27/002; G01L 9/00;
G01L 9/0041; G01L 9/0044; G01L
11/025; G01L 11/04; G01L 19/0023;
G01L 19/0672; G01L 19/069; G01L
19/142; G01L 19/145; G01L 19/16; G01L
7/00; G01L 9/0047; G01L 9/06; G01L
9/065; G01L 9/12; G01L 11/02; G01L
13/00; G01L 15/00; G01L 19/0015; G01L
19/003; G01L 19/02; G01L 19/0609;
G01L 19/083; G01L 19/10; G01L 19/148;
G01L 27/005; G01L 7/08; G01L 7/082;
G01L 7/163; G01L 7/166; G01L 9/0045;
G01L 9/0048; G01L 9/006; G01L 9/007;
G01L 9/0076; G01L 9/04; G01L 9/045;
G01L 9/125; G01L 11/00; G01L 17/00;
G01L 19/00; G01L 19/0076; G01L 19/08;
G01L 19/141; G01L 19/146; G01L 1/142;
G01L 1/2262; G01L 1/246; G01L 21/12;
G01L 23/16; G01L 27/007; G01L 7/04;
G01L 7/063; G01L 7/084; G01L 7/086;
G01L 7/16; G01L 9/0002; G01L 9/0007;
G01L 9/0016; G01L 9/0019; G01L
9/0022; G01L 9/0027; G01L 9/0033;
G01L 9/0039; G01L 9/005; G01L 9/0058;
G01L 9/0077; G01L 9/0079; G01L 9/008;
G01L 9/0092; G01L 9/0095; G01L 9/025;
G01L 9/08; G01L 9/085; G01L 9/105;
G01L 9/14; G01L 9/16
USPC .................................................. 73/700–756
See application file for complete search history.

(56) References Cited

U.S. PATENT DOCUMENTS

| | | |
|---|---|---|
| 9,667,297 B1 | 5/2017 | Miehl et al. |
| 2003/0216119 A1 | 11/2003 | Mashiko et al. |
| 2005/0091949 A1 | 5/2005 | Origlia |
| 2008/0196918 A1* | 8/2008 | Zadach ............. H05K 5/0213 174/50.5 |
| 2015/0330421 A1 | 11/2015 | Kotowicz |
| 2015/0334863 A1 | 11/2015 | Beer et al. |
| 2017/0042052 A1 | 2/2017 | Kotowicz |
| 2018/0263126 A1 | 9/2018 | Kerner et al. |

FOREIGN PATENT DOCUMENTS

| | | |
|---|---|---|
| CN | 104854971 A | 8/2015 |
| CN | 105144858 A | 12/2015 |
| CN | 205213200 U | 5/2016 |
| CN | 106465554 A | 2/2017 |
| CN | 106900151 A | 6/2017 |
| DE | 202004017039 U1 | 12/2004 |
| DE | 102004056662 A1 | 6/2006 |
| DE | 102015214923 A1 | 2/2017 |
| EP | 1313359 B1 | 7/2008 |
| JP | 2003133753 A | 5/2003 |
| JP | 2005158909 A | 6/2005 |
| JP | 2010278056 A | 12/2010 |
| WO | 2014073096 A1 | 5/2014 |
| WO | 2016096421 A2 | 6/2016 |

OTHER PUBLICATIONS

TDK-EPC AG & CO., KG., Pressure Sensor, AUR, 10.34 MC VR ZIE L K1779,TDK Product, B58621M3200B021, Feb. 23, 2011, p. 1.

* cited by examiner

B-B

A-A

HOUSING WITH PRESSURE COMPENSATING ELEMENT

This patent application is a national phase filing under section 371 of PCT/EP2018/083193, filed Nov. 30, 2018, which claims the priority of German patent application 102017128460.5, filed Nov. 30, 2017, each of which is incorporated herein by reference in its entirety.

TECHNICAL FIELD

The present invention relates to a geometric configuration of a housing opening for protection from direct jet water.

BACKGROUND

There are openings in housings which are intended to be permeable to gaseous media, although the inside of the housing is intended to be protected from dust and liquids. This is necessary, for example, if no positive or negative pressure is intended to arise in the housing as a result of temperature changes during processing or in an application. Also if ambient pressure is intended to prevail in the housing, for example as a reference pressure during a pressure measurement, an opening preamble to gaseous media is required. Such housing openings are then customarily closed by so-called pressure-compensating elements, for short PCEs. These PCEs allow air circulation or else the inlet and outlet of other gaseous media, but are not permeable to liquids up to a certain pressure.

However, PCEs do not permanently withstand relatively harsh stressing, as is for example, often specified for automotive applications. Corresponding loading can occur, for example as a result of contact, by stone impact, so-called gravel bombardment, or under the influence of jet water, for example from high-pressure cleaning. As a result of the mechanical loading, the PCEs are destroyed, release from the housing or are not tight during stressing.

SUMMARY

Embodiments provide an improved housing which is, for example, better protected from environmental influences. In particular, a pressure-compensating element is intended to be protected from damage from jet water.

A housing is proposed which a housing opening, a pressure-compensating element, which is mounted on an inner side of the housing opening, a protective wall, which is mounted on an outer side of the housing opening and surrounds the housing opening, and a bridge, which is arranged on the outer side of the housing opening and protrudes over the housing opening, wherein the bridge is shaped and arranged in such a way that a projection of the bridge at least partially covers the housing opening.

Within the housing there can be formed a housing interior which is configured to receive a sensor element. The inner side of the housing opening can be designated as the side which is connected to the housing interior. The outer side of the housing opening can be designated as the side which faces away from the housing interior.

The bridge and the protective wall can together be configured to protect the pressure-compensating element from jet water and other objects which could otherwise damage the pressure-compensating element. The bridge and the protective wall can be configured to minimize the angular range in which jet water impinging on the housing passes undisturbed to the pressure-compensating element.

The bridge and the protective wall can be formed from the same injection-molded part which also surrounds the housing interior. It is possible here to dispense with additional parts, such as for example, a cap or a protective film. The entire housing can consist of a single injection-molded part which forms the housing opening, the bridge and the protective wall.

The protective wall can circularly surround the housing opening. Alternatively, the protective wall can be arranged around the housing opening in certain portions in a circular segment shape. Here, cutouts can be formed in the protective wall between the circular segment-shaped portions, the cutouts preventing an object being able to close the protective wall.

A length of the protective wall in a direction perpendicular to the housing opening can be at least five times a diameter of the housing opening. The length is preferably at least ten times the diameter of the housing opening. This ratio of the length of the protective wall to the diameter of the housing opening can ensure that virtually only perpendicularly incident jet water is not deflected by the protective wall. Perpendicularly incident jet water can furthermore be deflected by the bridge. It is thus possible to ensure that jet water always at first strikes the bridge or the protective wall, loses some of its energy there and reaches the housing opening and in particular the pressure-compensating element only in damped form. The length of the protective wall refers here to the extent of the protective wall perpendicular to the diameter of the housing opening.

The housing opening can be covered by the projection of the bridge to an extent of at least 60%. The housing opening is preferably covered by the projection of the bridge to an extent of at least 80%. The housing opening is preferably completely covered by the projection of the bridge. The higher the degree of coverage of the housing opening by the bridge, the better the pressure-compensating element is protected from damage. In some cases, the degree of coverage can be limited for manufacturing-related reasons. For example, with the entire housing being manufactured as a single injection-molded part, it may, dependent on the housing geometry, not always be possible for the bridge to completely cover the housing opening.

In the housing there can be formed a housing interior which is connected to the surroundings of the housing only via the housing opening. The housing opening can be arranged in a bottom of the housing interior, wherein the bottom is flat. Alternatively, the housing opening can be arranged in a bottom of the housing interior, wherein the bottom has a first region, in which the housing opening is formed, and a second region, which is offset with respect to the first region by a step.

The housing opening can be configured to ensure pressure compensation between the housing interior and the surroundings of the housing. Here, gaseous media can pass through the pressure-compensating element. For example, the housing can be configured in such a way that an ambient pressure is always established in the housing interior.

The pressure-compensating element can be permeable to gaseous media and impermeable to liquid media up to a certain pressure.

The housing can meet the requirements of protection class IP X9k. The IP protection classes stipulate the extent to which an electrical component can be exposed to environmental influences without being damaged or constituting a safety risk. An IP X9k housing is protected from penetrating water from any direction even with greatly increased pressure against the housing, with a pressure of 80-100 bar which can be achieved by high-pressure or steam jet cleaners being regarded as a greatly increased pressure.

In particular, the combination of pressure-compensating element, bridge and protective wall can ensure that the requirements of protection class IP X9k are met.

The housing can have a housing wall which forms an outer side of the housing, wherein the housing wall extends further in a direction away from the housing opening than the protective wall, with the result that an end of the protective wall that is remote from the housing opening does not protrude beyond the housing wall. The housing wall can thus protect the protective wall from mechanical damage. The housing wall can enclose the housing interior. Furthermore, the housing wall can enclose the protective wall.

The housing wall and the protective wall can be formed by different regions of a one-piece injection-molded part. The housing can be configured in such a way that it can be formed by plastics injection-molding with two mold halves without additional slides.

The pressure-compensating element can be applied to the inner side of the housing opening by a welding process. Alternatively, the pressure-compensating element could be adhesively bonded to the inner side of the housing opening.

The housing can be a pressure sensor housing. The housing interior can accordingly be suitable for receiving a pressure sensor element.

Further embodiments provide a sensor which has the above-described housing and a sensor element which is arranged within the housing.

BRIEF DESCRIPTION OF THE DRAWINGS

The present invention will be explained more fully below on the basis of the exemplary embodiments shown in the figures.

DETAILED DESCRIPTION OF ILLUSTRATIVE EMBODIMENTS

Figure 1:
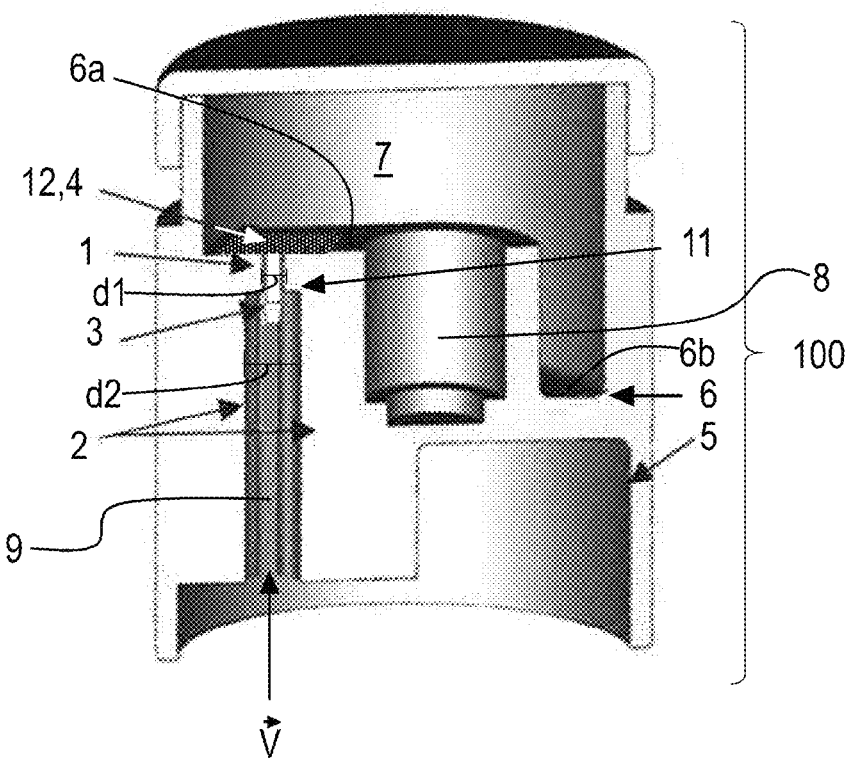
FIG. 1 shows a sectional view of the housing according to a first embodiment, with the section line perpendicular to a bridge.
Figure 2:
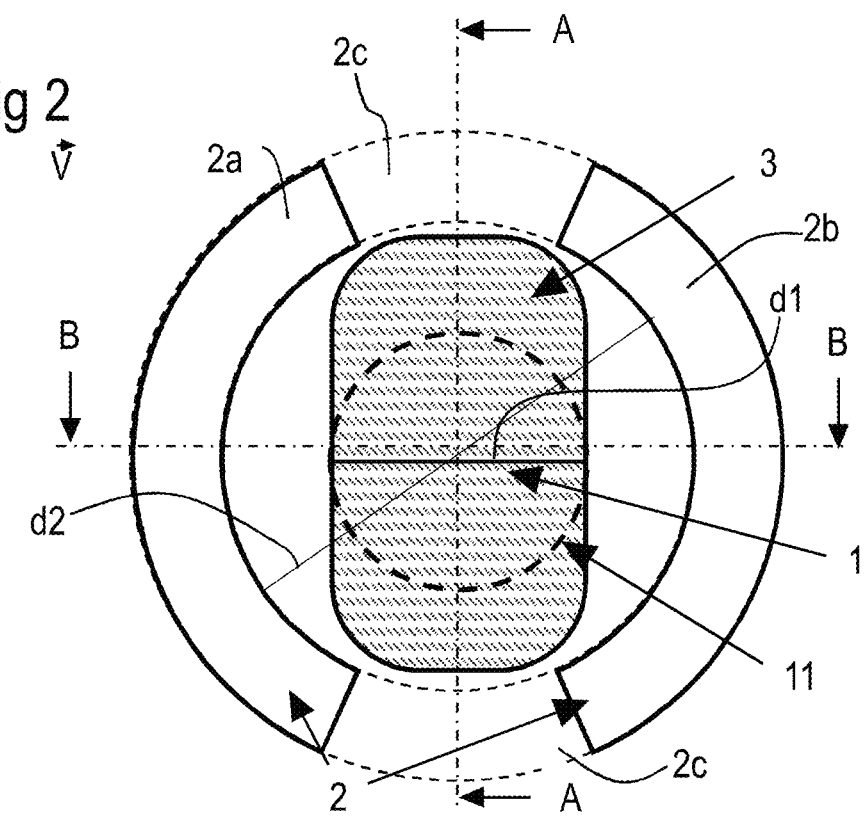
FIG. 2 shows a schematic plan view of a housing opening in the direction of penetration V of a medium.

FIG. 1 shows a housing 100 according to a first exemplary embodiment. Here, the housing 100 is shown in a sectional view along a section line B-B (see FIG. 2). FIG. 2 shows a schematic plan view of a housing opening 1 in the direction of penetration V of a medium, for example, for the housing 100 shown in FIG. 1.

The housing 100 has a housing interior 7. A sensor element can be arranged in the housing interior 7. For this purpose, a depression 8 for receiving the sensor element is formed in the housing interior 7. The housing interior 7 is closed by a pressure-compensating element 4. The pressure-compensating element 4 serves for separating liquid media, with the result that only gaseous media can enter the inside of the housing 100.

The housing 100 further comprises a housing opening 1 having an outer side 11 and an inner side 12. The outer side 11 is connected to the external surroundings of the housing 100. The inner side 12 of the housing opening 1 is connected via the pressure-compensating element 4 to the housing interior 7 formed in the housing 100. The housing interior 7 is here connected to the external surroundings of the housing 100 only via the housing opening 1.

The housing opening 1 has a diameter d1. One end of the housing opening 1 is covered by the pressure-compensating element 4. This end is connected to the housing interior 7 via the pressure-compensating element 4. The opposite end of the housing opening 1 is connected to a duct 9 surrounded by a protective wall 2.

The housing 100 is an injection-molded part. The housing opening 1 and the protective wall 2 are both formed in this injection-molded part. Here, the housing opening 1 and the protective wall 2 are formed by different regions of the injection-molded part. The housing opening 1 here is to be considered as the region of the injection-molded part which has the diameter d1. The protective wall 2 is to be considered as the region of the injection-molded part which has a second diameter d2.

Also defined is a direction of penetration V of a medium through the housing opening 1 into the housing interior 7 that is directed from outside to inside.

The protective wall 2 serves for protecting the housing interior 7 from large particles which could clog the housing opening 1 or could cause mechanical damage to the housing opening 1. Moreover, the protective wall 2 ensures that jet water impinging on the housing 100 can directly reach the housing opening 1 only in a very small angular range. Since the protective wall 2 has a length in the direction V that is more than five times the diameter d2 of the protective wall 2, virtually only perpendicularly incident jet water reaches the housing opening 1 without previously being deflected by the protective wall 2.

The protective wall 2 forms the aforementioned duct 9, which adjoins the housing opening 1 in the opposite direction to the direction of penetration V. The duct 9 formed by the protective wall 2 has the diameter d2. The diameter d2 is larger than the diameter d1. Accordingly, the housing opening 1 is narrower than the duct 9 formed by the protective wall 2. The transition from the duct 9 to the housing opening 1 thus forms a narrow point which is configured to prevent penetrating jet water from reaching the pressure-compensating element 4 unimpeded.

The protective wall 2 is enveloped by a housing wall 5. The housing wall 5 protects the protective wall 2 from mechanical loading. In the opposite direction to the direction of penetration V, the housing wall 5 protrudes beyond the protective wall 2.

In the first exemplary embodiment, the housing wall 5 and the protective wall 2 are manufactured in one piece. Here, the housing wall 5 and the protective wall 2 are formed by a single injection-molded part. The protective wall 2 is here considered to be that part of the injection-molded part which directly surrounds the duct 9 connected to the housing opening 1. The housing wall 5 is considered to be the outer part of the injection-molded part, that is to say the part with the largest diameter.

Over the outer side 11 of the housing opening 1 there is also arranged a bridge 3 which spans the housing opening 11. The bridge 3 is also a region of the injection-molded part which forms the housing 100. The bridge 3 is thus formed in one piece with the housing opening 1 and the protective wall 2. The bridge 3 consists of the same material as the housing opening 1 and the protective wall 2.

The course of the bridge 3 is perpendicular to the section line B-B. Therefore, only a cross section of the bridge arch can be seen in FIG. 1. Here, the bridge 3 and the outer side 11 of the housing opening 1 are configured in such a way that, with a projection of the bridge 3 onto the housing opening 11, part of the housing opening 11 is covered. The bridge 3 is configured in such a way that as large a part as possible of the housing opening 1 is covered by the bridge 3. For manufacturing-related reasons, complete coverage cannot always be possible.

The bridge 3 protects the housing opening 1 from direct penetration of the housing opening 1 by bar-like objects and from jet water. As can be seen in FIG. 2, the bridge 3 completely or virtually completely covers the housing opening 1. The bridge 3 covers at least a central part of the housing opening 1, with the result that jet water in a central part cannot directly enter the housing opening 1. Consequently, the pressure-compensating element 4 is also protected by the bridge 3 from damage by jet water. The bridge 3 and the protective wall 2 are designed in such a way that their interaction prevents jet water directly reaching the pressure-compensating element 4 without previously being deflected by the bridge 3 or the protective wall 2. If the jet water first of all strikes the bridge or the protective wall 2, it is thereby deflected and loses some of its force. Accordingly, the risk of damage to the pressure-compensating element by the jet water is considerably reduced.

The housing opening 1 is formed in a bottom 6 of the housing interior 7. The bottom 6 has a first region 6a and a second region 6b. The housing opening 1 is arranged in the first region 6a. The second region 6b is offset with respect to the first region 6a by a step. The second region 6b is offset with respect to the first region 6a in the opposite direction to the direction of penetration V. Accordingly, in the direction of penetration V, the inner side 12 of the housing opening 1 is situated in a raised position with respect to the second region 6b of the bottom 6.

Figure 3A:
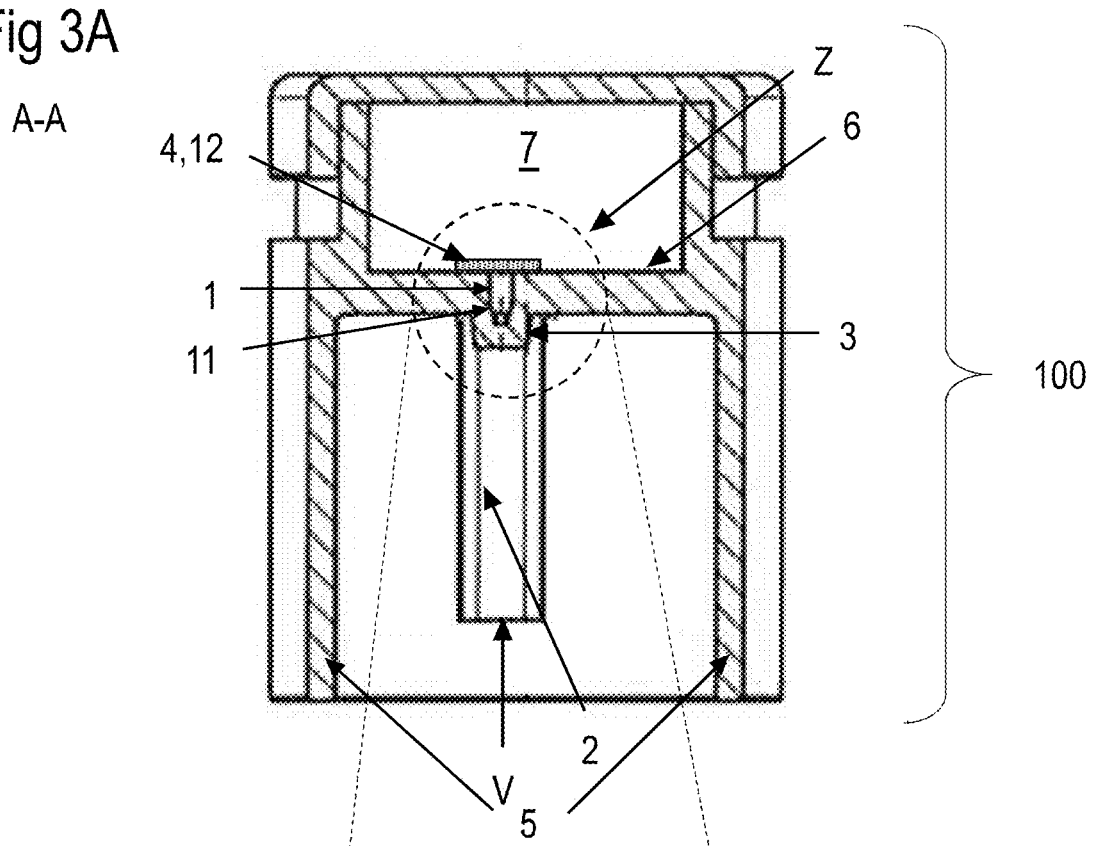
FIG. 3A shows a schematic section of the housing according to a second embodiment, with the section line parallel to the bridge.
Figure 3B:
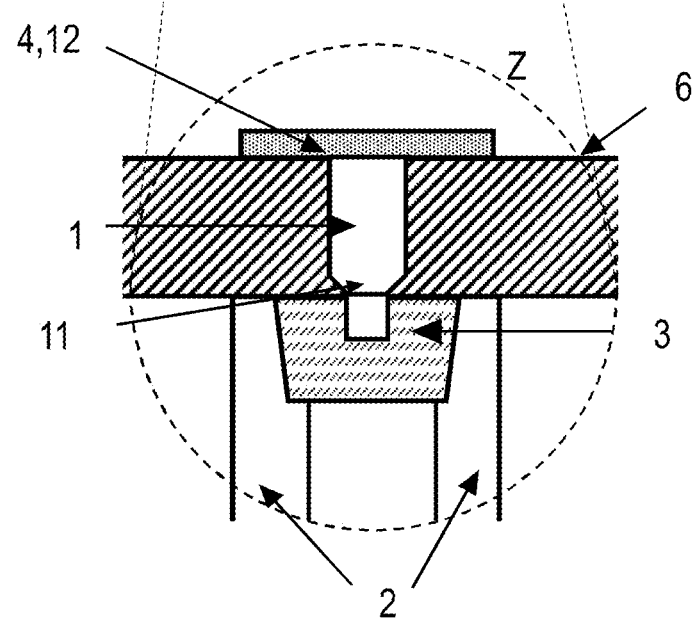
FIG. 3B shows a detail of FIG. 3A.

FIG. 3A shows a housing 100 according to a second exemplary embodiment. FIG. 3A here shows the housing in a sectional view. FIG. 3B shows a detail of FIG. 3 in an enlarged view.

The sectional view shown in FIGS. 3A and 3B is based on the section line A-A, which is oriented parallel to the bridge 3, as also shown in FIG. 2. FIG. 3A depicts a circular region Z which is illustrated in FIG. 3B as an enlarged detail. FIG. 3A serves for illustrating the position of the housing opening 1 and of the protective walls 2 in relation to the housing 100. FIG. 3B serves for detailed illustration of the housing opening 1.

In the sectional views of FIGS. 3A and 3B, the bridge 3 is illustrated as a trapezoidal arch which spans over the outer side 11 of the housing opening 1 and has a cutout on the parallel side of the trapezoid that is directed toward the housing opening. However, this geometric shape can be adapted in any desired manner in order to optimize both production by the injection-molding method and the function of the protection from jet water. The pressure-compensating element 4 is arranged on the inner side 12 of the housing opening 1. Here, in the embodiment shown, the inner side 12 of the housing opening 1 is situated in a plane with the bottom 6 of the inside of the housing.

The second exemplary embodiment of the housing 100 differs from the first exemplary embodiment in terms of the configuration of the housing interior 7. According to the second exemplary embodiment, the housing interior 7 has a bottom 6 in which the housing opening 1 is formed, wherein the bottom 6 is flat.

A further difference between the first and the second exemplary embodiment lies in the configuration of the protective wall 2. According to the second exemplary embodiment, the protective wall 2 is not formed integrally with the housing wall 5. Rather, the protective wall 2 and the housing wall 5 are spaced apart from one another.

In the opposite direction to the direction of penetration V, the protective wall 2 does not protrude beyond the housing wall 5. Rather, the protective wall 2 is set back from the housing wall 5. As a result, the protective wall 2 is protected from mechanical loading which acts on the housing wall 5.

The bridge 3 is arranged close to that end of the protective wall 2 which faces the housing opening 1. The bridge 3 is thus arranged deep within the protective wall 2. As viewed in the direction of penetration V, the bridge 3 is arranged in the last quarter of the protective wall 2, preferably in the last tenth. By virtue of the deep position of the bridge 3 within the protective wall 2, the bridge 3 offers good protection for the housing opening 1 against jet water. The bridge 3 is arranged and configured in such a way that jet water can either not directly reach the housing opening 1 at all or that jet water can directly strike the housing opening 1 only from a very small angular range.

FIG. 2 shows a schematic plan view of the bridge 3 oriented toward the direction of penetration V. In this view, the housing opening 1 is situated below the bridge 3. The bridge 3 is configured in such a way that it as far as possible completely covers the housing opening 1. The protective wall 2 is arranged around the housing opening 1 and also around the bridge 3. The protective wall 2 has two mutually opposite portions 2a, 2b which each have a circular segment-shaped cross section. The two portions 2a, 2b of the protective wall 2 are separated from one another by cutouts 2c.

The cutouts 2c serve for preventing the housing opening being clogged by an object which could be placed onto an opening of the protective walls 2. However, the cross-sectional shape of the protective wall 2 is not reduced to this shape, but can assume any geometric shape or combination of shapes. In particular, the protective wall 2 can be completely or partially integrated into the housing wall 5. The cutouts 2e extend only over part of the length of the protective wall 2.

The two section lines A-A parallel to the bridge and B-B perpendicular to the bridge are also shown in the plan view. The vector of the direction of penetration V is situated at the point of intersection of section lines A-A and B-B and points into the plane of the drawing.

Figure 4:
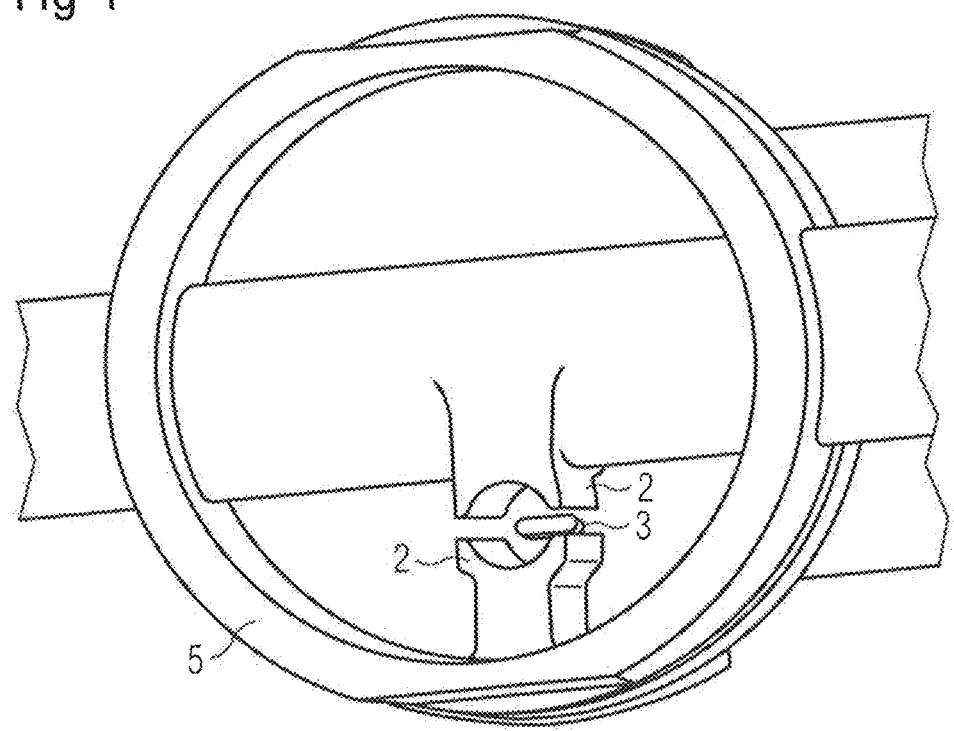
FIG. 4 shows a perspective 3D view of the housing as viewed on a side on which the housing opening is formed.
Figure 5:
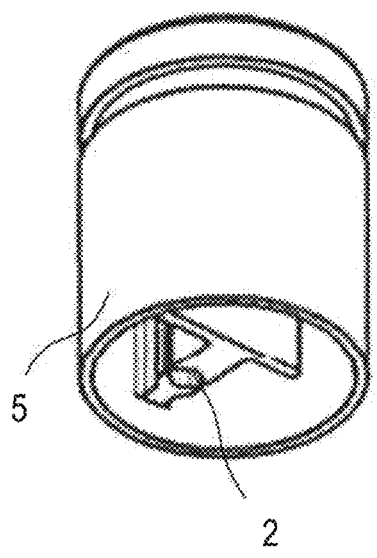
FIG. 5 shows a schematic illustration of the housing in a perspective view.
Figure 6:
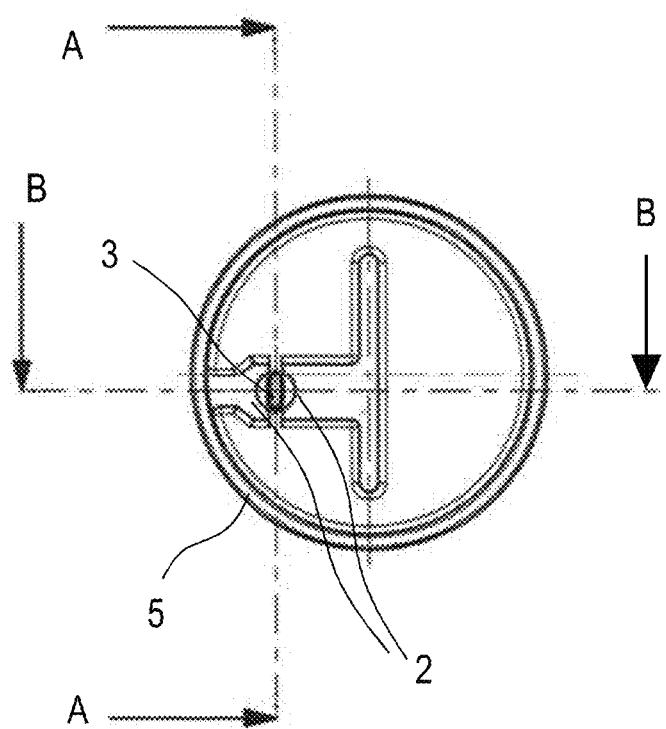
FIG. 6 shows a schematic plan view of the housing opening in the direction of penetration V of a medium.

FIG. 4 shows a perspective view of the housing 100 according to the second exemplary embodiment as viewed on a side on which the housing opening is formed. FIG. 5 shows a schematic illustration of the housing 100 in a perspective view. FIG. 6 shows a schematic plan view of the housing opening in the direction of penetration V of a medium.

The invention claimed is:
1. A housing comprising:
   a housing opening;
   a pressure-compensating element mounted on an inner side of the housing opening;
   a protective wall mounted on an outer side of the housing opening surrounding the housing opening; and a bridge arranged over the outer side of the housing opening and protruding beyond the housing opening, wherein the bridge is shaped and arranged such that a projection of the bridge at least partially covers the housing opening, wherein the protective wall has two mutually opposite portions separated from one another by two cutouts, and wherein the bridge extends along a direction of a connecting line between the cutouts.

2. The housing according to claim 1, wherein the protective wall is designed to deflect jet water.

3. The housing according to claim 1, wherein the bridge is designed to deflect perpendicularly incident jet water.

4. The housing according to claim 1, wherein the housing opening is covered by the bridge at least in a central region.

5. The housing according to claim 1, wherein the protective wall circularly surrounds the housing opening, or wherein the protective wall is arranged around the housing opening in certain portions in a circular segment shape.

6. The housing according to claim 1, wherein a length of the protective wall in a direction perpendicular to the housing opening is at least five times a diameter of the housing opening.

7. The housing according to claim 1, wherein the housing opening is covered by the projection of the bridge to an extent of at least 60%.

8. The housing according to claim 1, wherein a housing interior is formed in the housing and is connected to surroundings of the housing only via the housing opening.

9. The housing according to claim 8, wherein the housing opening is arranged in a bottom of the housing interior, and wherein the bottom is flat.

10. The housing according to claim 8, wherein the housing opening is arranged in a bottom of the housing interior, and wherein the bottom has a first region, in which the housing opening is formed, and a second region, which is offset with respect to the first region by a step.

11. The housing according to claim 8, wherein the housing opening is configured to ensure pressure compensation between the housing interior and the surroundings of the housing.

12. The housing according to claim 1, wherein the pressure-compensating element is permeable to gaseous media and impermeable to liquid media.

13. The housing according to claim 1, wherein the housing meets requirements of protection class IP X9k.

14. The housing according to claim 1, wherein the housing has a housing wall, which forms the outer side of the housing, and wherein the housing wall extends further in a direction away from the housing opening than the protective wall so that an end of the protective wall that is remote from the housing opening does not protrude beyond the housing wall.

15. The housing according to claim 14, wherein the housing wall and the protective wall are formed by different regions of a one-piece injection-molded part.

16. The housing according to claim 1, wherein the pressure-compensating element is applied to the inner side of the housing opening by a welding process.

17. The housing according to claim 1, wherein the housing is a pressure sensor housing.

18. A sensor comprising:

the housing according to claim 1; and a sensor element arranged inside the housing.

19. A housing comprising:

a housing opening;

a pressure-compensating element mounted on an inner side of the housing opening;

a protective wall mounted on an outer side of the housing opening surrounding the housing opening; and a bridge arranged over the outer side of the housing opening and protruding beyond the housing opening, wherein the bridge is shaped and arranged such that a projection of the bridge at least partially covers the housing opening, wherein a housing interior is formed in the housing and is connected to surroundings of the housing only via the housing opening, wherein the housing opening is arranged in a bottom of the housing interior, and wherein the bottom has a first region, in which the housing opening is formed, and a second region, which is offset with respect to the first region by a step.

20. A housing comprising:

a housing opening;

a pressure-compensating element mounted on an inner side of the housing opening;

a protective wall mounted on an outer side of the housing opening surrounding the housing opening; and a bridge arranged over the outer side of the housing opening and protruding beyond the housing opening, wherein the bridge is shaped and arranged such that a projection of the bridge at least partially covers the housing opening, wherein the housing has a housing wall, which forms the outer side of the housing, and wherein the housing wall extends further in a direction away from the housing opening than the protective wall so that an end of the protective wall that is remote from the housing opening does not protrude beyond the housing wall.

* * * * *

UNITED STATES PATENT AND TRADEMARK OFFICE
CERTIFICATE OF CORRECTION

PATENT NO. : 11,274,986 B2
APPLICATION NO. : 16/767522
DATED : March 15, 2022
INVENTOR(S) : Benjamin Bohl et al.

It is certified that error appears in the above-identified patent and that said Letters Patent is hereby corrected as shown below:

In the Claims

Claim 5, Column 7, Line 21; delete "certain" in between "in" and "portions".

Signed and Sealed this
Twenty-sixth Day of April, 2022

Katherine Kelly Vidal
*Director of the United States Patent and Trademark Office*